United States Patent
Mohammad

Patent Number: 5,389,803
Date of Patent: Feb. 14, 1995

[54] HIGH-GAIN SI/SIGE MIS HETEROJUNCTION BIPOLAR TRANSISTORS

[75] Inventor: S. Noor Mohammad, Hopewell Junction, N.Y.

[73] Assignee: International Business Machines Corporation, Armonk, N.Y.

[21] Appl. No.: 38,372

[22] Filed: Mar. 29, 1993

[51] Int. Cl.$^6$ ............... H01L 31/072; H01L 31/109; H01L 27/082; H01L 31/117
[52] U.S. Cl. .................... 257/197; 257/198; 257/565; 257/616
[58] Field of Search ............ 257/19, 26, 197, 198, 257/200, 565, 580, 616

[56] References Cited

U.S. PATENT DOCUMENTS

| | | | |
|---|---|---|---|
| 4,704,785 | 11/1987 | Curran | 437/110 |
| 4,771,326 | 9/1988 | Curran | 357/34 |
| 4,958,201 | 9/1990 | Mimura | 357/16 |
| 4,990,991 | 2/1991 | Ikeda et al. | 357/34 |
| 5,006,912 | 4/1991 | Smith et al. | 357/34 |

FOREIGN PATENT DOCUMENTS

| | | | |
|---|---|---|---|
| 1187863 | 7/1989 | Japan | 257/198 |
| 291948 | 3/1990 | Japan | 257/198 |
| 2106937 | 4/1990 | Japan | 257/197 |

OTHER PUBLICATIONS

Semiconductor Devices–Physics and Technolgy, S. M. Sze, Jan. 1985, Chapter 1, pp. 1–3.
T. F. Kuech, et al., "Epitaxial Growth of Ge on 100 SI by a Simple Chemical Vapor Depostion Technique" App. Phys. Lett. 39(3), pp. 245–247, Aug. 1, 1981.
M. A. Green, et al., "Super-Gain Silicon MIS Heterojunction Emitter Transistors" IEEE Electron Device Letters, vol. EDL-4, No. 7, pp. 225–227, Jul. 1983.
D. V. Lang, et al., "Measurement of the Band Gap of GeXSi1-x/Si Strained Layer Heterostructures" Appl. Phys. Lett. 47 (12), pp. 1333–1335, Dec. 15, 1985.
R. People, et al., "Band Alignments of Coherently Strained GeXSi1-x/Si Heterostructures on 001 GeySi1-y Substrates" Appl. Phys. Lett. 48 (8) Amer. Inst. Of Physics, pp. 538–540, Feb. 1986.
L. P. Ramberg, et al., "Abrupt Interface AlGaAs/GaAs Heterojunction Bipolar Transistors: Carrier Heating & ... " J. Appl. Phsy. 63(3), Amer. Inst. of Physics, pp. 809–820, Feb. 1, 1988.
A. Das, et al., "Numerical Study of Emitter-Base Junction Design for AlGaAs/GaAs Heterojunction Bipolar Transistors" IEEE Transactions on Electron Devices, V. 35, No. 7, pp. 863–870.
D. R. Young, "Charge Trappin in SiO$_2$" The Physics and Chemistry of SiO$_2$ and the Si-SiO$_2$ Interface, Plenum Press, pp. 487–496, 1988.
S. S. Iyer, et al., "Heterojunction Bipolar Transistors Using Si-Ge Alloys" Transactions on Electron Devices, V. 36, No. 10, pp. 2043–2064, Oct. 1989.
S. C. Jain, et al., "Structure, Properties & Applications of GexSi1-x Strained Layers & Superlattices" Semiconductor Sci. Technology, pp. 547–576, 1991.

*Primary Examiner*—Steven Ho Yin Loke
*Attorney, Agent, or Firm*—Charles W. Peterson, Jr.

[57] ABSTRACT

A Metal Insulator Semiconductor (MIS) heterojunction transistor. The MIS transistor is in a layered wafer having a n$^+$ Si substrate, n Si collector layer, and a p Si/SiGe base. The base Si/SiGe interface may be vertical or horizontal. A thin oxide layer separates the base from the emitter, which is of a low work function metal such as Al, Mg, Mn, or Ti.

9 Claims, 6 Drawing Sheets

HIGH-GAIN SI/SIGE MIS HETEROJUNCTION BIPOLAR TRANSISTORS

FIELD OF THE INVENTION

The present invention is related to bipolar transistors and more particularly to Metal-Insulator-Semiconductor bipolar transistors.

BACKGROUND OF THE INVENTION

Bipolar transistors are known in the art. Metal Insulator Semiconductor (MIS) bipolar transistors are known in the art. A prior art MIS transistor is represented in FIG. 1. A very thin layer of insulator 50 such as $SiO_2$, between a metal emitter 52 and semiconductor base 54 prevents base to emitter current flow. However, when $V_{be}$ is large enough, hot electrons from the emitter tunnel through the insulator 50 to the base 54. This voltage is called the tunnel voltage and the current is called tunnel current. Since the hot electrons forced through the insulator are high energy electrons, they are "ballistic" as opposed to drift electrons. These ballistic electrons traverse the base 54 so quickly that, they seldom recombine with holes before entering the collector 56. Thus, MIS transistors have increased DC current gain over prior art bipolar transistors because of attenuated recombination in the base 54. However, because the emitter is still a source of drift electrons, prior art MIS transistors still suffer from carrier recombination in base 54.

Consequently, minimizing this source of drift electrons is a primary consideration in fabricating MIS transistors. In this prior art MIS transistor, the collector 56 is an n-type epitaxial layer on an n-type substrate 58. Metal base contacts 60 are isolated from the emitter 52 by thick field oxide 62. A backside contact 64 provides voltage to the collector 56 through substrate 58. To maximize DC current gain, the base dopant level is high, maximizing the base and the collector shunt resistance. If, however, the base dopant is too high, base to collector capacitance is excessive and attenuates AC current gain.

Heterojunction bipolar transistors (HBTs) are known in the art. A heterojunction has one or more layers of at least two dissimilar semiconductor materials that have different energy at the conduction and valence band edges ($E_c$ and $E_v$ respectively) and different electron affinities. Thus, the heterojunction layer interface creates band gap spikes $\Delta E_c$ and $\Delta E_v$. $\Delta E_c$ and $\Delta E_v$ reinforce current flow in one (forward biased) direction and reduce current flow in the other (reverse biased) direction. Because the electrons effectively tunnel through the conduction potential spike, $\Delta E_c$, this increased forward current flow is also known as tunnel current. Consequently, unlike (homojunction) bipolar transistors, because $\Delta E_c$ and $\Delta E_v$ reinforce DC current flow in one direction and reduce it in the other, an HBT's emitter and collector are not considered interchangeable. Thus, properly biased HBTs have an increased DC current gain over traditional homojunction bipolar transistors.

However, because HBTs suffer from effects normally ignored for homojunction bipolar transistors, instead of 2–4 orders of magnitude current improvement, prior art HBTs only have, at best, slightly more than one order of magnitude. DC current gain is impaired, partially, because the conduction band discontinuity $\Delta E_c$ is not as large as the valence band discontinuity $\Delta E_v$. Since hole mobility is significantly lower than electron mobility, $\Delta E_v$ reduces hole injection from the base to the emitter and collector significantly; whereas, $\Delta E_c$ is insufficient to affect more than a slight reduction in electron injection from the emitter into the base. Consequently, DC current gain improvement is limited.

Additionally, DC current gain improvement is impeded by current leakage caused by heterojunction layer lattice mismatch, e.g., between Si and SiGe. During device processing, these heterojunction layers may intermix or, dislocations may form at the interface. Intermixing tends to homogenize the heterojunction, smoothing the band discontinuities and reducing $\Delta E_c$ and $\Delta E_v$. If intermixing occurs, neither hole nor electron current is minimized. A dislocation in the HBT's active area acts as a diffusion pipe, i.e., a leakage path. Dislocations also form electron traps in the HBT's base-emitter interface, base, and base-collector interface regions. These traps lead to unwanted recombination. Increasing $V_{be}$ and $V_{cb}$ to overcome these traps and reduce the resulting recombination, unfortunately, also reduces $\Delta E_v$, which allows more hole injection from the base into the emitter. Thus, DC current gain decreases because the base to emitter current increases without a resulting increase in collector to emitter current.

PURPOSES OF THE INVENTION

It is the purpose of the present invention to increase MIS transistor DC current gain.

It is another purpose of the present invention to reduce parasitic base to emitter capacitance in MIS transistors.

It is yet another purpose of the present invention to increase base to emitter shunt resistance in MIS transistors.

It is yet another purpose of the invention to reduce parasitic base to emitter capacitance and increase base to collector shunt resistance in MIS transistors.

It is yet another purpose of this invention to increase DC current gain, reduce parasitic base to emitter capacitance and increase base to collector shunt resistance in MIS transistors.

SUMMARY OF THE INVENTION

The present invention is a Metal Insulator Semiconductor (MIS) transistor comprising: an insulating substrate layer of a first semiconductor material; a collector layer of said first semiconductor material and of a first conduction type on said substrate layer; a base layer of a second conduction type on said first collector layer having at least 2 discrete regions of a first and a second semiconductor material; a thin oxide layer on said second conduction layer; and, a metal layer on said thin oxide layer. The substrate layer, collector layer, and first semiconductor material are Si and the second semiconductor material is SiGe. In a first embodiment, the two discrete base regions are vertical. In a second embodiment, the two discrete base regions are horizontal.

DETAILED DESCRIPTION OF THE PREFERRED EMBODIMENT

Figure 1:
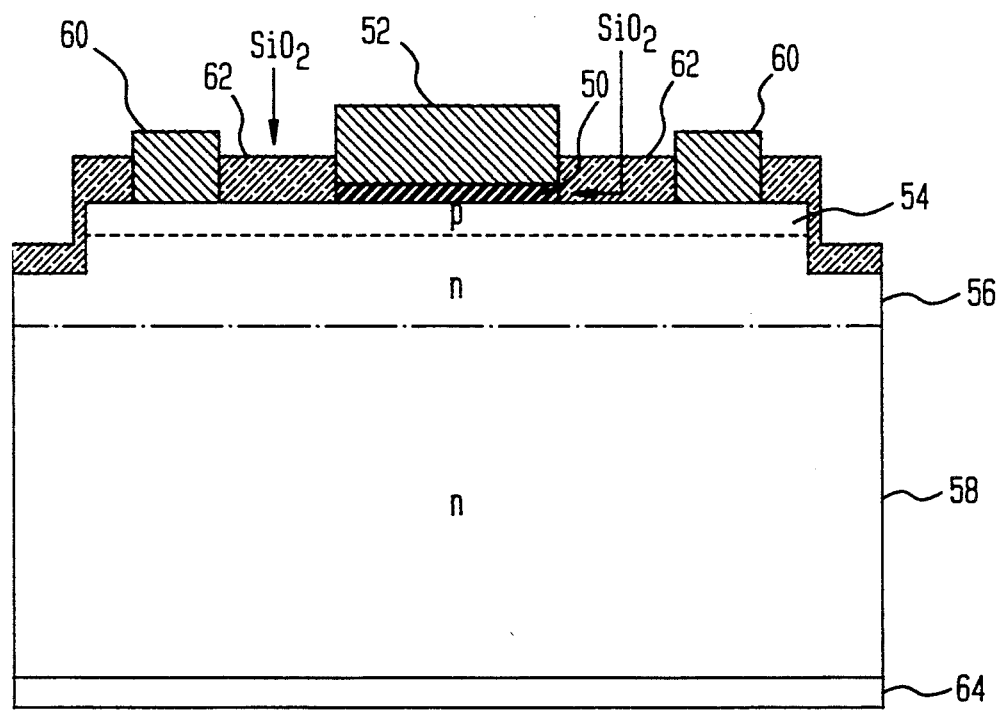
FIG. 1 is a cross section of a prior art MIS transistor.
Figure 2:
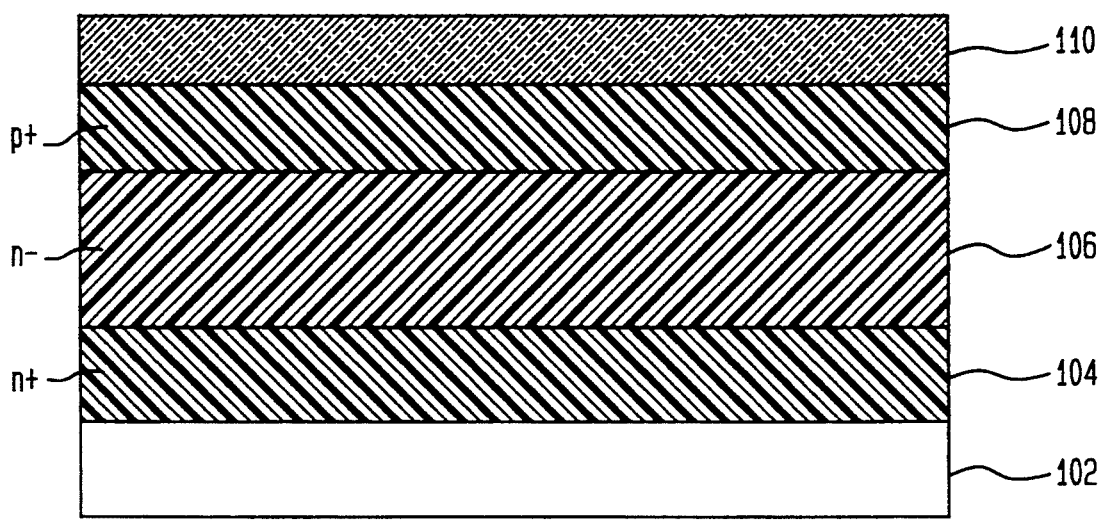
FIGS. 2a–F show the steps in fabricating a preferred embodiment of the present invention.

FIG. 2A is a representation of a layered wafer 100 grown for a preferred embodiment Metal-Insulator-Semiconductor (MIS) transistor. On insulating substrate 102, n+ silicon collector layer 104 is grown by any conventional method, such as Molecular Beam Epitaxy (MBE) or High Vacuum Metal Organic Chemical Vapor Deposition (HV-MOCVD). Collector layer 104 is between 0.4 and 0.8 μm thick and n-doped with a dopant concentration between $5-8 \times 10^{18}$ cm$^{-3}$. Next, n Si collector layer 106 is grown on collector layer 104. Collector layer 106 is between 0.3 and 0.5 μm thick and is doped with a dopant concentration between $1-5 \times 10^{16}$ cm$^{-3}$ with arsenic, phosphorus or an equivalent dopant. A 0.2–0.6 μm thick base layer 108 is grown on collector layer 106. Base layer 108 is doped with a p-type dopant concentration between $0.5-5 \times 10^{18}$ cm$^{-3}$. Each of these layers 104–108 may be doped during epitaxial growth. The final step is growing a 0.1 μm thick SiO$_2$ layer 110 on the base layer 108.

Figure 2B:
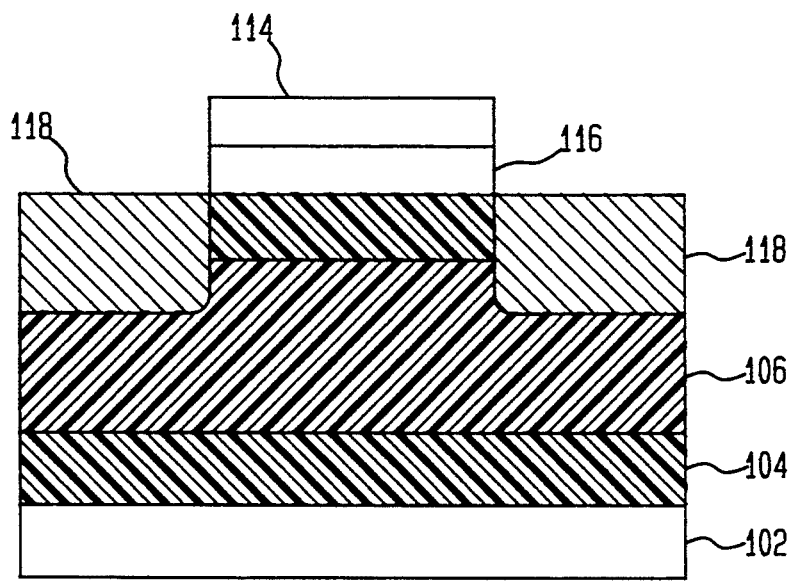

After growing the multilayered wafer 100, the preferred embodiment MIS transistor may be defined, as shown in FIG. 2B. First, SiO$_2$ layer 110 is etched back to uncover the top surface 112 of base layer 108. The emitter area is photolithographically defined by photoresist 114. Oxide is removed from non-emitter areas, leaving the emitter area capped with photoresist 114 and underlaying SiO$_2$ 116. Next, the exposed portions of base layer 108 are ion implanted. The implanted dopant is diffused to a depth of 0.10 to 0.20 μm at a dopant density of $0.5-5 \times 10^{19}$ cm$^{-3}$ to form diffusion areas 118.

Figure 2C:
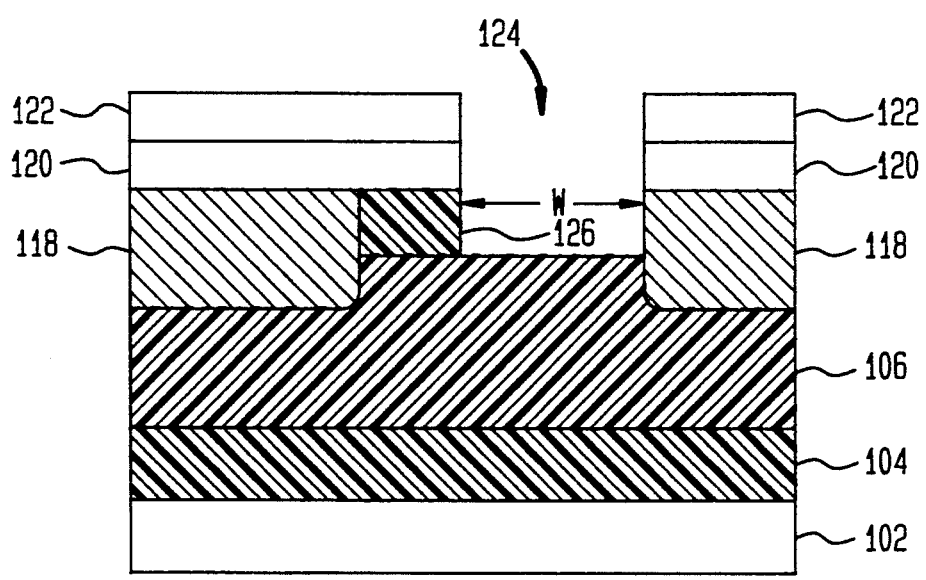

Next, in FIG. 2C, both the photoresist cap 114 and underlaying SiO$_2$ 116 are removed. A layer 1–1.5 μm thick of oxide 120 is grown over the exposed surface 112. Photoresist 122 defines a small Aperture 124. In the preferred embodiment, Aperture 124 is 200–600 Å deep by 0.2 to 0.5 μm wide (w), and is as small as possible. The Aperture 124 extends through the photoresist 122, the oxide layer 120 and base layer 108, isolating one of the diffused base regions 118 from the undiffused base region 126 under the emitter area.

Figure 2D:
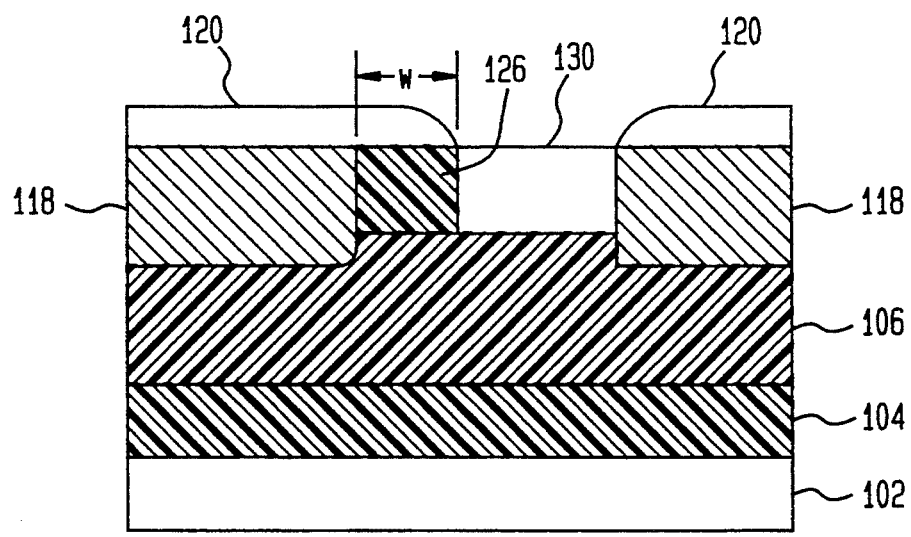

After removing photoresist layer 122, in FIG. 2D, the edges of oxide layer 120 are rounded along the Aperture 124. A discrete region or plug 130 of Si$_{1-z}$Ge$_z$ (where z is the mole fraction of Ge in SiGe, preferably $0.70 \leq z \leq 1.00$) is grown selectively to fill Aperture 124. The Si$_{1-z}$Ge$_z$ (hereinafter SiGe) plug 130 is grown in region 124 such that a heterojunction forms, vertically aligned with the {100} plane of undiffused base area 126. The SiGe plug 130 is doped with a p-type impurity to a dopant concentration of $10^{15}-10^{16}$cm$^{-3}$. Any excess SiGe, which may have grown inadvertently on the oxide 120 surface, is removed with a suitable etchant, preferably sulfuric acid. Thus, p++ Si area 118 and plug 130 sandwich the second discrete region, p+ Si region 126. The width of p+ Si region 126 is not critical and, also, may be made as small as possible. In the preferred embodiment, with plug 130 being 0.5 μm, p+ Si region 126 is 0.25 μm (w').

Figure 2E:
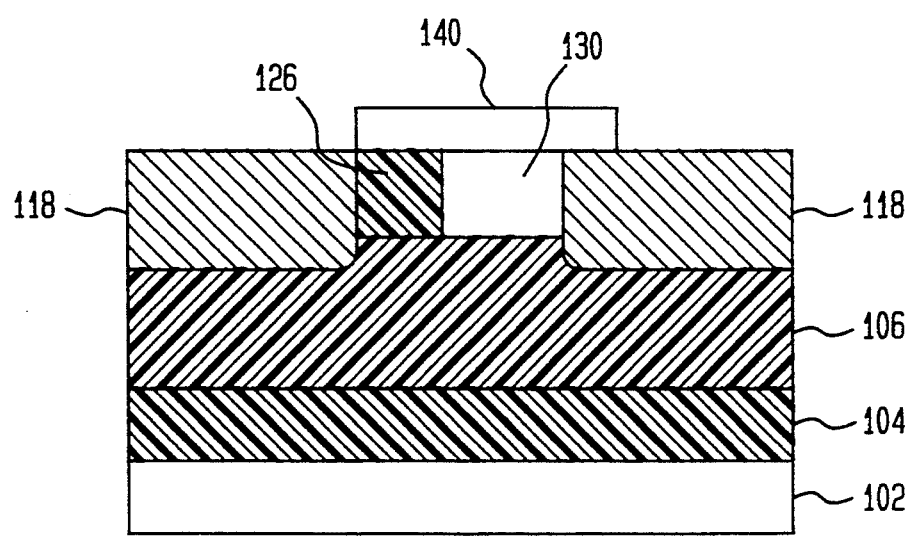

Next, the oxide layer 120 is removed and the exposed surface is covered with a thin insulator layer (20–50 Å) of preferably SiO$_2$. As shown in FIG. 2E, thin oxide is photolithographically defined, so that emitter oxide 140 remains only over the plug 130 and p+ Si area 126.

Figure 2F:
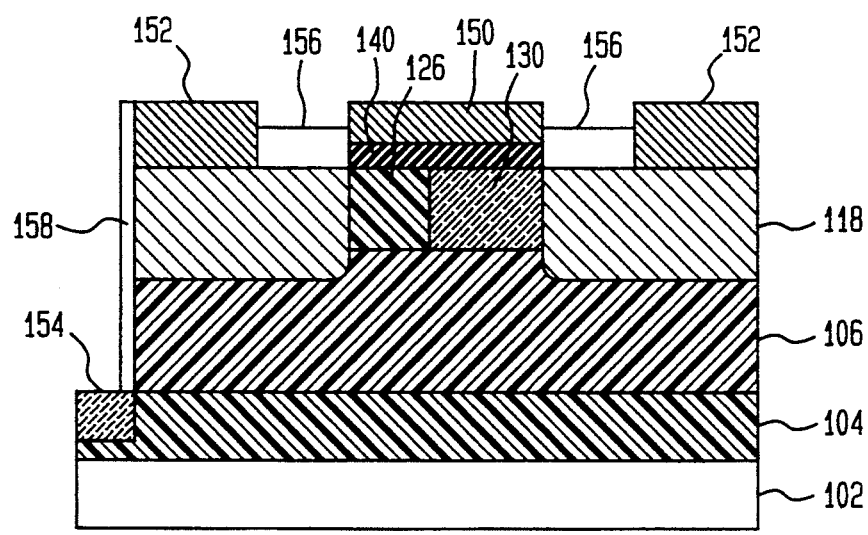

Aluminum is deposited on the emitter oxide 140 to form the emitter 150 in FIG. 2F. Alternatively, the emitter may be of another low work function metal such as Mn, Mg or Ti. A groove is etched through the base and the second collector layer 106 to the first collector layer 104. Metal, preferably aluminum, is deposited to form the base electrode 152 and the collector electrode 154. Thick SiO$_2$ 156 is grown to insulate and passivate the top surface of the transistor. The side wall of the trench is passivated by a thin silicon nitride layer 158.

Figure 3:
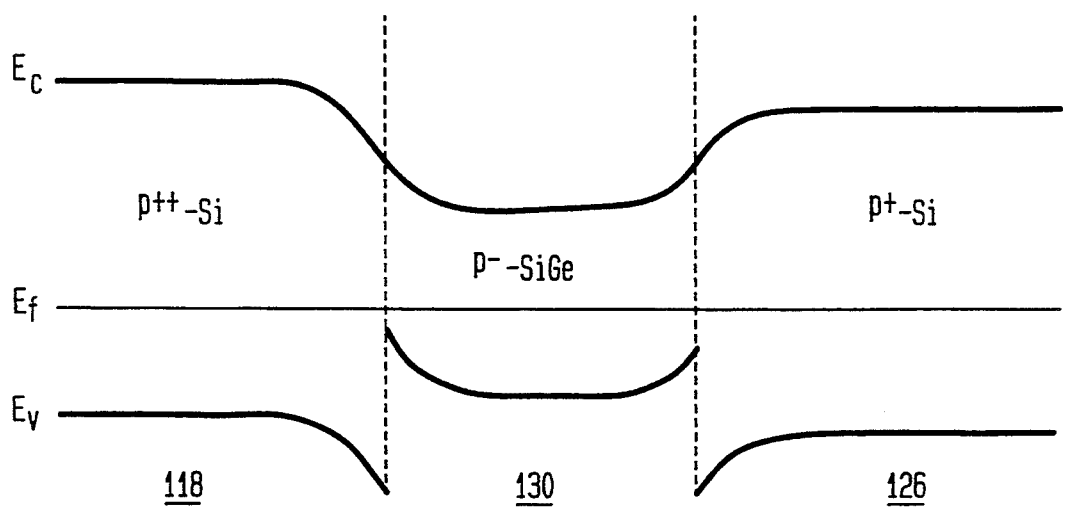
FIG. 3 is an energy band gap diagram of the first embodiment MIS transistor of FIG. 2F.

The base of the preferred embodiment transistor has an energy band diagram as in FIG. 3, where $E_c$ is the conduction band edge energy, $E_v$ is the valence band edge energy and $E_f$ is the Fermi level. Since the bottom of the conduction band in p$^-$ SiGe 130 is much lower than that of either silicon region 126 or 118, the plug 130 acts as an energy well and, consequently, provides the primary path for electrons between the emitter 150 and collector 106.

Figure 4A:
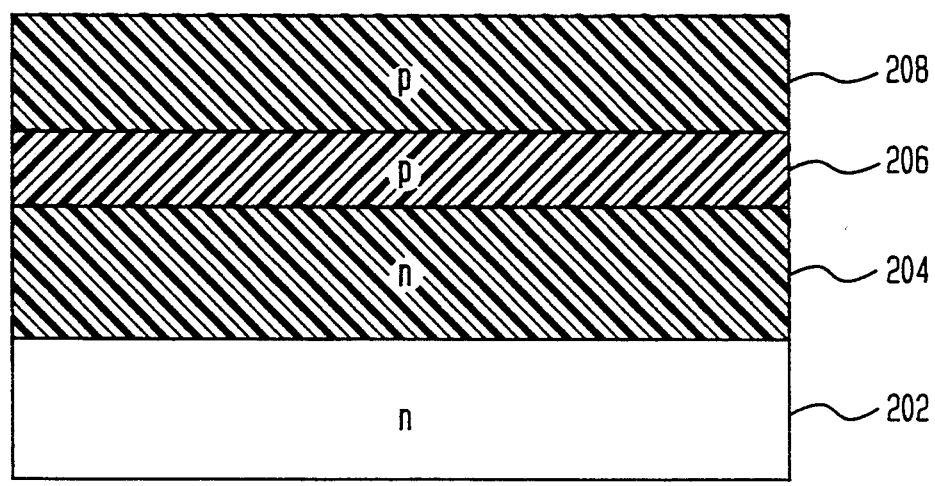
FIGS. 4A–B show an alternate embodiment of the present invention.

In a second preferred embodiment of the present invention, the heterojunction is vertical in the base of the transistor and the collector contact is a backside contact. The layered wafer 200 of the second preferred embodiment is represented in FIG. 4A. The substrate layer 202 is 1.0 to 2.0 μm thick n+ Si doped to a dopant density of between $1-7 \times 10^{18}$ cm$^{-3}$. Next, 0.3–0.8 μm collector layer of n Si 204 is grown on the substrate 202. The collector layer 204 is doped to a dopant density of $10^{16}$ cm$^{-3}$. A first base layer 206 of p doped SiGe is grown on the collector layer 204. The first base layer 206 is doped to a dopant density between $3-8 \times 10^{16}$ cm$^{-3}$. The thickness of the first base layer 206 is selected to minimize dislocations and interlayer defects while keeping the valence band discontinuity $\Delta E_v$ at the Si/SiGe interface large enough to provide a deep quantum well. Preferably, for a Ge mole fraction of 0.18, the first base region or layer 206 is 200–300 Å thick. Finally, a 0.1 μm thick, second base region or layer 208 of p doped Si, p- Si doped to $1-5 \times 10^{18}$ cm$^{-3}$, is grown on the first base layer 206.

Figure 4B:
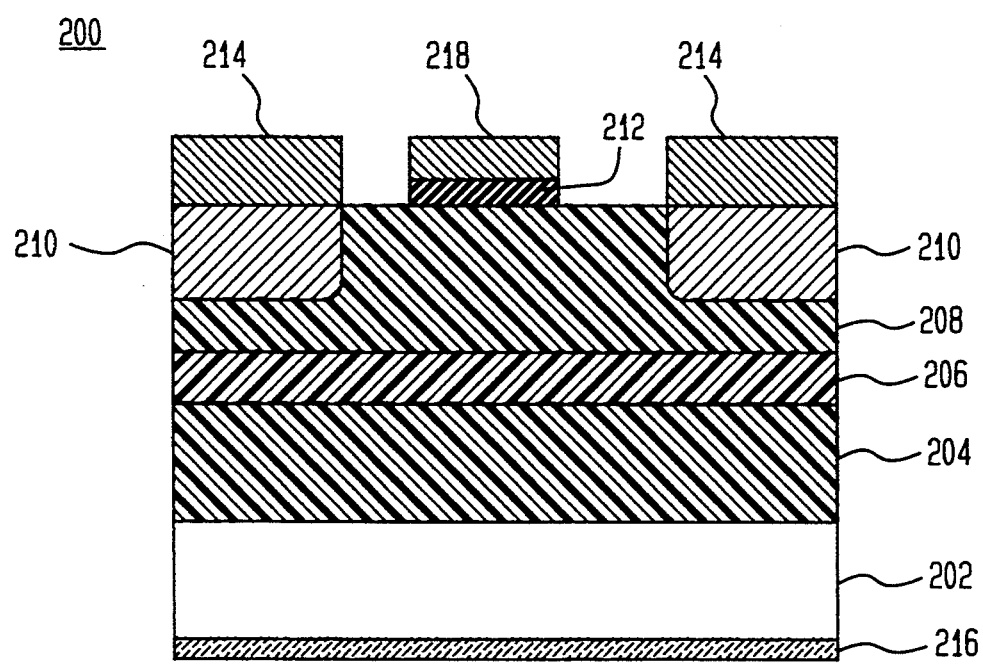

Having thus grown the layered wafer 200, the second preferred embodiment transistor, may be defined and fabricated (see FIG. 4B). Fabrication of the second preferred embodiment transistor is simpler than for the first because, the base heterojunction forms horizontally in the second preferred embodiment, i.e., the layers of different semiconductors are horizontal instead of vertical. So, base electrode regions 210 are defined identically as were the base electrode regions 118 of the first preferred embodiment. Alternatively, to further simplify defining base electrode regions 210, growing the oxide layer 110 may be omitted and, instead, photoresist may be applied directly to the surface of the second base layer 208.

Next, a thin emitter oxide 212 layer is grown and photolithographically defined as in the first preferred embodiment. Aluminum is applied and patterned to form base contacts 214, collector backside contact 216 and emitter 218. Alternatively, as in the first preferred embodiment, the emitter 218 may be formed of another low work function metal, prior to forming base contact 214 and collector backside contact 216.

Figure 5A:
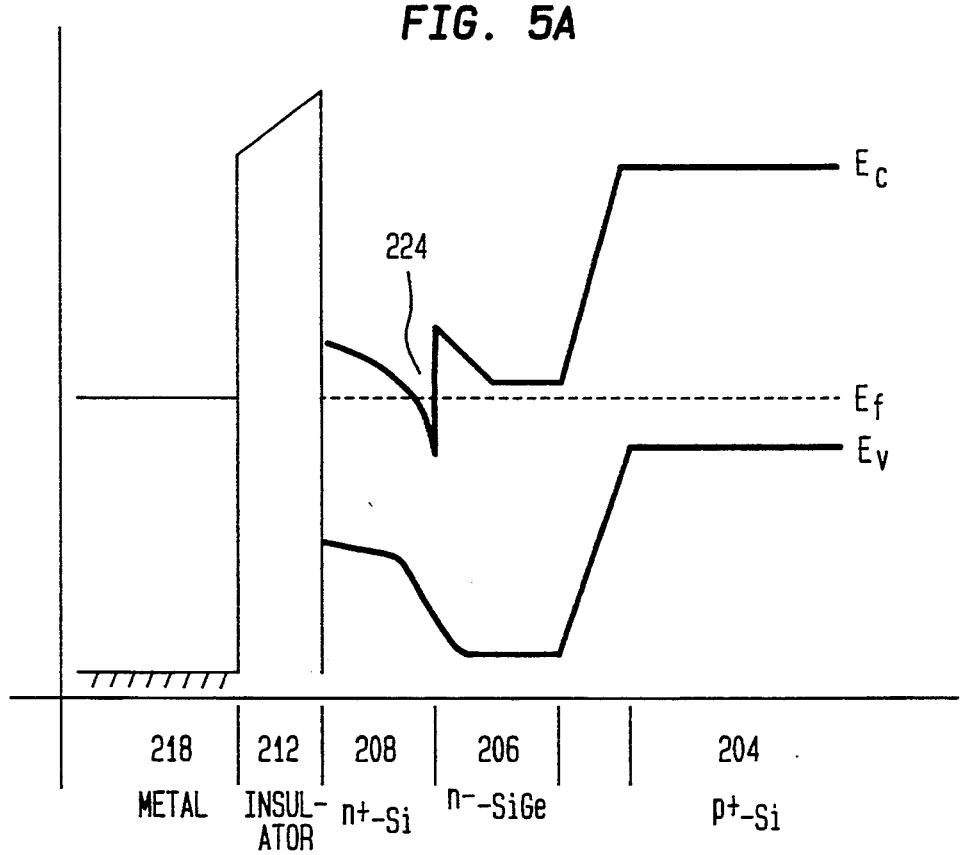
FIGS. 5A–B show energy band gap diagrams of the alternate embodiment MIS transistor.
Figure 5B:
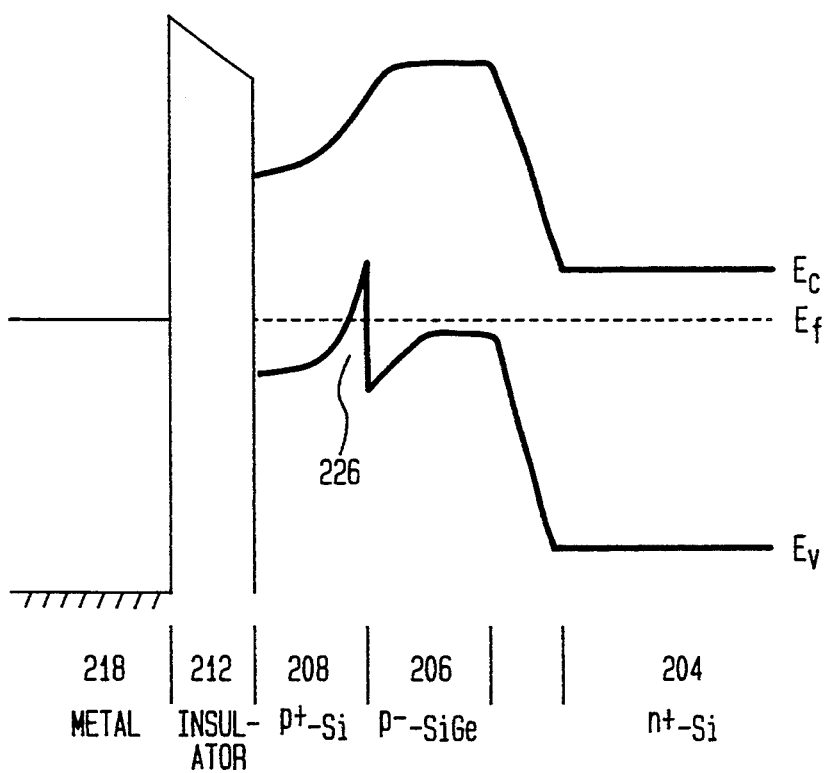

FIG. 5A is an electron energy band diagram for a MIS bipolar transistor with a layered semiconductor structure according to the second preferred embodiment but of opposite conduction types, with a p-type collector and n-type base. FIG. 5B is a hole energy band diagram for a MIS bipolar transistor with an n-type collector and a p-type base according to the second preferred embodiment. As can be seen from the electron energy band diagram of FIG. 5A, the emitter oxide 212 forms a high potential barrier. This potential barrier prevents drift current flow between the transistor's base 208 and its emitter 218. However, when $V_{be}$ is large enough, hot electrons tunnel through the emitter oxide 212 and enter the base 208. Since these are ballistic electrons, only minor carrier recombination occurs in the base. Consequently, base current leakage is low and DC current gain is high, significantly higher than for prior art transistors. The valence band quantum well 226 in the npn embodiment and the conduction band quantum well 224 in pnp embodiment transistor trap minority carriers prior to entering the emitter, and more importantly, provide a very high mobility path for minority carriers from intrinsic base region 208 to the extrinsic base regions 210. This suppresses leakage and further improves DC current gain.

While the present invention is described in terms of preferred embodiments, numerous modifications and variations will occur to a person of ordinary skill in the art without departing from the spirit and scope of the present invention.

I claim:

1. A MIS transistor comprising:
   an isolating substrate;
   a collector layer of a first conduction type and of a first semiconductor material on said substrate;
   a base layer of said first semiconductor material on said collector layer, said base layer of a second conduction type;
   a thin oxide layer on said base layer;
   a plug of a second semiconductor material forming a discrete area in said base layer,
   said plug and a portion of said base layer of said first semiconductor material formed on and extending from said collector layer to said thin oxide layer; and
   a low work function metal on said thin oxide layer.

2. The MIS transistor of claim 1 wherein said first semiconductor material is Si and said second semiconductor material is SiGe.

3. The MIS transistor of claim 2 wherein said first conduction type is n type and said second conduction type is p type.

4. The base layer of the MIS transistor of claim 3 including a first base contact diffusion area adjacent said plug and said portion of said base layer of said first semiconductor material between said plug and a second base contact diffusion area.

5. The MIS transistor of claim 4 wherein the collector layer comprises a first layer of a first dopant concentration and a second layer of a second dopant concentration at least an order of magnitude less than said first dopant concentration, said first collector layer adjacent said substrate and said second collector layer adjacent said base layer.

6. The MIS transistor of claim 5 wherein the low work function metal is comprised of Al.

7. The MIS transistor of claim 5 wherein the low work function metal is comprised of Mn.

8. The MIS transistor of claim 5 wherein the low work function metal is comprised of Mg.

9. The MIS transistor of claim 5 wherein the low work function metal is comprised of Ti.

* * * * *